United States Patent Office 2,916,407

Patented Dec. 8, 1959

2,916,407

SURFACE TREATMENT OF SILICON

Thomas M. Buck and Frank S. McKim, Plainfield, N.J., assignors to Bell Telephone Laboratories, Incorporated, New York, N.Y., a corporation of New York No Drawing. Application October 4, 1956
Serial No. 613,828

9 Claims. (Cl. 134—30)

This invention relates to the fabrication of silicon devices, and more particularly to the surface treatment of the silicon bodies characteristically included in such devices.

It is well known that the electrical characteristics of most forms of semiconductive devices are greatly affected by the rate of recombination of minority carriers at the surface of the semiconductor body included in such devices. In particular, it is well known that in a junction transistor disadvantageously the current amplification factor is lower and the collector junction saturation current is higher the higher the surface recombination velocity of minority carriers in the semiconductor. It will be convenient to refer to the surface recombination velocity of minority carriers simply as the surface recombination velocity.

Hitherto, it has been difficult to realize a low surface recombination velocity in silicon. Consequently, this is a factor that has made it difficult to realize high values of current amplification and low values of collector saturation current in silicon junction transistors.

An object of the present invention is to realize a low surface recombination velocity on silicon.

A related object is to improve in a silicon junction transistor the current amplification factor and the collector junction saturation current by reducing the surface recombination velocity of the silicon element included therein.

For maximum utility, it is important that the treatment employed provide a reduction in the rate of surface recombination which is stable over long periods of time and that the results be readily reproducible. Additionally, it is advantageous that the treatment be quick, easy and inexpensive to carry out.

The treatment which forms the present invention does achieve the principal ends sought in a quick, easy and inexpensive manner.

One feature of the present invention comprises boiling the silicon body, after the usual final etching just before encapsulation, in a suitably chosen cleaning solution, most advantageously water free of contaminants, such as deionized water. Appropriately done, such boiling has been discovered to decrease the surface recombination velocity on silicon to a suitably low value. This is especially surprising because boiling in deionized water was earlier found to increase the surface recombination velocity on germanium.

A complementary feature comprises encapsulating the silicon element, after boiling as described, in a suitable stabilizing atmosphere which is free of agents which increase the surface recombination velocity. The specific composition of the stabilizing atmosphere is governed by various other considerations, as will be discussed in greater detail below. This step serves to keep the surface recombination velocity steady at the low value achieved by the boiling.

In a preferred embodiment of the invention, a silicon element, after a final etch, is boiled in deionized water for approximately fifteen minutes and, after drying, is encapsulated in a hermetically sealed container which provides an appropriately chosen ambient, typically dry oxygen.

While enclosure in a hermetically sealed container filled with dry oxygen has been employed hitherto for the stabilization of the surface of a germanium element, as previously indicated boiling a germanium element in the manner characteristic of the present invention would effect an undesirable increase in its surface recombination velocity.

There will now be set forth in detail, by way of illustration, an exemplary treatment in accordance with the present invention which has been employed successfully for stablizing at a low value the recombination velocity of the surface of silicon. In the interest of simplicity, it will be assumed that the silicon specimen has previously undergone various fabrication treatments for adapting it for use in a junction transistor, such as the formation of emitting and collecting junctions therein and the attachment of emitter, base and collector electrodes, as is characteristic of the fabrication of a junction transistor.

As is the usual practice before encapsulation, the wafer is given a final etch to remove surface material damaged by such earlier fabrication treatment. Typically, the etch may be a mixture, in the ratio of ten to one by volume, of an aqueous solution of nitric acid which included 70 percent by weight nitric acid and an aqueous solution of hydrofluoric acid which included by weight 48 percent hydrogen fluoride. Immersion in such a mixture for several minutes ordinarily provides adequate etching.

An alternative etch which may be used is a silver glycol mixture formed by combining by volume forty parts of an aqueous nitric acid solution including by weight 70 percent nitric acid, one part of an aqueous hydrofluoric acid solution including by weight 48 percent hydrogen fluoride, one part of an aqueous silver nitrate solution including by weight one percent silver nitrate, twenty parts of deionized water, and twenty parts of propylene glycol. Immersion in such an etch for between five and ten minutes ordinarily provides adequate etching.

Various other etches have been employed without especially impairing the effectiveness of the subsequent treatment, although it is advantageous to employ etchants which leave a minimum of residue on the silicon surface.

After the etching, it is usually advantageous to wash the silicon element thoroughly in running deionized water, conveniently at room temperature.

There after, in accordance with the present invention the silicon element is soaked for fifteen minutes in boiling water under atmospheric conditions. The water is typically kept in a Pyrex container during such boiling. It is found that the effectiveness of the treatment increases with increasing boiling time although a limit is reached. In the cases investigated boiling longer than fifteen minutes adds little more to the effectiveness of the treatment. However, in special instances, longer boiling times might prove worthwhile.

Some slight improvement is often discernible after boiling for one or two minutes. In some instances, significant reductions in the surface recombination velocity have been achieved after boiling for as little as five minutes. While some improvement can be realized by immersion in water which is heated to a temperature below its boiling point, for example, 75 degrees C., optimum results are achieved when the water is boiling, and the boiling continued for at least fifteen minutes. Additionally, it is possible to employ immersion in water which is heated under pressure to temperatures in excess of 100 degrees C.

It is found important that the water used for boiling include therein a minimum of undesirable impurities. Since a wide variety of foreign substances which have been investigated have been found to be undesirable impurities, this is most easily assured by the use of deionized water which is also free of organic impurities. In particular, the best results have been achieved consistently with the use of deionized water having a conductance of the order of $1\times10^{-7}$ mho/centimeter. Typically, water of this purity has been realized by use of an Illco-Way laboratory size deionizer model MB-520 which employs a mixed-bed ion exchange column using organic exchange resins. Satisfactory results have also been achieved using commercial grade distilled water having a conductance of the order of $1\times10^{-6}$ mho/centimeter. Although it is advantageous to employ water having a conductance no higher than this, in those instances when it seems preferable to minimize the cost of the treatment at expense of some reduction in its effectiveness, water having a higher conductance, for example, of the order of $1\times10^{-5}$ mho/centimeter, may be employed.

Satisfactory results have also been achieved by boiling either in an aqueous solution of hydrogen peroxide including by weight 30 percent hydrogen peroxide in commerical grade distilled water or in dilute aqueous solutions of nitric acid in commercial grade distilled water. In particular, it seems important to employ as the cleaning solution a hot aqueous solvent which dissolves readily inorganic material and which is itself free of contaminants. However, in the interest of both simplicity and reliability, the preferred practice is to employ deionized water as described.

In particular, after boiling in deionized water as described, the surface recombination velocity of the silicon is generally reduced to the order of $10^2$ centimeter/second and less. This compares with a value typically $5\times10^3$ and higher before such boiling.

After boiling for the prescribed time, the silicon specimen is removed and the excess water is drawn off with clean filter paper.

The results which have been achieved suggest that pure water at high temperatures removes from the silicon surface ionic impurities which provide recombination centers and thereby reduces the recombination velocity of minority carriers, but the exact mechanism is not known. The treatments previously known for reducing the surface recombination velocity did not result in a clean surface so that it seems clear that they did not depend on any cleaning action. Moreover, as previously indicated, the treatment described when applied to a germanium specimen results instead in a temporary increase in the surface recombination velocity. The original value, however, will be gradually restored if the germanium specimen is allowed to stand in air.

In order to stabilize the silicon surface at the reduced value of surface recombination, encapsulation in a suitable ambient is necessary since the surface is degraded rapidly under atmospheric conditions. Ordinarily, it is advantageous to encapsulate the element shortly after the boiling treatment. However, if storage for an extended time before encapsulation is more convenient, storage in a suitable ambient for such time is feasible.

Various techniques for encapsulation are possible depending on the ambient desired. The choice of ambient is affected by two relatively independent factors.

First, the ambient should be chosen so that the recombination velocity is stabilized at the reduced value made possible by the boiling treatment described. In particular, in this regard chlorine, nitrogen and hydrogen chloride, when dry, appear to be suitable gaseous ambients. Additionally, oxygen either dry or including water vapor up to a relative humidity of 75 percent has been found to be a particularly suitable ambient for stabilizing the surface recombination velocity at its reduced value. A vacuum also has been found conducive to stability.

Second, the ambient should be chosen so that the amount of surface channeling is kept to an unobjectionable level. Surface channels are leakage paths over the surface of the semiconductive body. For example, in the conventional junction transistor, surface channels are leakage paths over the surface between the emitter and collector zones. Surface channeling is a problem of particular importance in junction transistors made by the alloy process but is relatively insignificant in junction transistors made by a double vapor-solid diffusion process of the kind described in application Serial No. 516,674, filed June 20, 1955, by C. S. Fuller and M. Tanenbaum, now Patent No. 2,861,018, since in the resulting design, the base zone has appreciably no surface which is exposed.

In those instances where surface channelling might be serious, it is desirable to select from among the stabilizing ambients discussed one which tends to alleviate the problem. In particular, a dry oxygen ambient minimizes the formation of surface channels on p-type silicon so that its use as the ambient is advantageous with an n-p-n alloy junction transistor. Alternatively, a wet oxygen ambient minimizes the formation of surface channels on n-type silicon so that its use as the ambient is advantageous with a p-n-p alloy junction transistor.

Moreover, dry nitrogen and a vacuum are found to be quite neutral.

However, in applications where surface channelling is relatively unimportant, such as with double vapor-solid diffusion junction transistors, dry oxygen is the preferred ambient both because of its high stabilizing effect and its convenience of use.

Various techniques for encapsulation are feasible. Typically, there may be employed the technique described for a germanium specimen in copending application Serial No. 514,038, filed June 8, 1955, now Patent No. 2,777,974, for W. H. Brattain and C. G. B. Garrett. Essentially such technique comprises mounting the silicon element on a suitable support structure within a container which is provided with an exhaust tubulation but is otherwise hermetically sealed, evacuating the container by way of the exhaust tubulation, then refilling the container with the desired ambient by way of the tubulation, and thereafter sealing off the tubulation.

What is claimed is:

1. The process of reducing the surface recombination velocity of a silicon body which comprises the steps of boiling the body for at least several minutes in water having a conductance no greater than of the order of $1\times10^{-5}$ mho/centimeter and thereafter maintaining the body in a gaseous ambient substantially free from agents which increase the surface recombination rate.

2. The process of reducing the surface recombination velocity of a silicon body which comprises the steps of boiling the silicon body for at least five minutes in water having a conductance no greater than of the order of $1\times10^{-5}$ mho/centimeter and thereafter encapsulating the wafer in a gaseous stabilizing ambient substantially free from agents which increase the surface recombination rate.

3. The process of reducing the surface recombination velocity of a silicon wafer which comprises the steps of boiling the silicon wafer for at least five minutes in water having a conductance no greater than of the order of $1\times10^{-6}$ mho/centimeter and thereafter encapsulating the wafer in a dry oxygen ambient.

4. The process of reducing the surface recombination velocity of a silicon element which comprises the steps of boiling the silicon element for at least fifteen minutes in water having a conductance no greater than of the order of $1\times10^{-5}$ mho/centimeter and thereafter encapsulating the element in a gaseous stabilizing ambient substantially free from agents which increase the surface recombination velocity.

5. The process of reducing the surface recombination velocity of a silicon element which comprises the steps of boiling the silicon element for at least fifteen minutes in water having a conductance no greater than of the order of $1\times10^{-6}$ mho/centimeter and thereafter encapsulating the element in a gaseous stabilizing ambient substantially free from agents which increase the surface recombination velocity.

6. The process of reducing the surface recombination velocity of a silicon wafer which comprises the steps of boiling the silicon wafer for at least fifteen minutes in water having a conductance no greater than of the order of $1\times10^{-6}$ mho/centimeter and thereafter encapsulating the wafer in a dry gaseous ambient.

7. The process of reducing the surface recombination velocity of a silicon wafer which comprises the steps of boiling the silicon wafer for at least fifteen minutes in water having a conductance no greater than $1\times10^{-6}$ mho/centimeter and thereafter encapsulating the wafer in a vacuum.

8. The process of reducing the surface recombination velocity of a silicon body which comprises the steps of boiling the silicon wafer for at least fifteen minutes in deionized water having a conductance less than $1\times10^{-6}$ mho/centimeter, removing all excess water from the surface of the wafer, and thereafter encapsulating the wafer in an oxygen water-vapor ambient having a relative humidity between zero and 75 percent.

9. The process of reducing the surface recombination velocity of a silicon body which comprises the steps of boiling the silicon wafer for at least fifteen minutes in deionized water having a conductance less than $1\times10^{-6}$ mho/centimeter, removing all excess water from the surface of the wafer, and thereafter encapsulating the wafer in a dry oxygen ambient.

References Cited in the file of this patent

UNITED STATES PATENTS

| | | |
|---|---|---|
| 2,619,414 | Heidenreich | Nov. 25, 1952 |
| 2,633,437 | Detjen | Mar. 31, 1953 |
| 2,740,700 | Fuller | Apr. 3, 1956 |
| 2,742,383 | Barnes et al. | Apr. 17, 1956 |